United States Patent [19]

Smialek

[11] Patent Number: 5,049,539
[45] Date of Patent: Sep. 17, 1991

[54] LOW COST, FORMABLE, HIGH TC SUPERCONDUCTING WIRE

[75] Inventor: James L. Smialek, Strongsville, Ohio

[73] Assignee: United States of America, as represented by the Administrator, Nat'l. Aero & Space Admin., Washington, D.C.

[21] Appl. No.: 305,675

[22] Filed: Jan. 31, 1989

[51] Int. Cl.$^5$ .............................................. B32B 9/00
[52] U.S. Cl. ...................................... 505/1; 505/701; 505/702; 505/703; 505/704; 421/209; 421/457; 421/688; 421/930
[58] Field of Search ........................... 505/1, 701–704; 29/599; 428/209, 457, 688, 930

[56] References Cited

U.S. PATENT DOCUMENTS

| | | | |
|---|---|---|---|
| 3,243,871 | 4/1966 | Saur | 29/155.5 |
| 4,171,464 | 10/1979 | Steyert, Jr. | 174/126 S |
| 4,339,508 | 7/1982 | Tsuya et al. | 428/606 |
| 4,411,959 | 10/1983 | Braginski et al. | 48/558 |
| 4,826,808 | 5/1989 | Yurek et al. | 505/1 |

OTHER PUBLICATIONS

Gruen et al., "Formation of Perovskite Surface Layers by Oxidation of Cu–La–Si Alloys", J. Electrochemical Society Vol. 134 No. 6, Jun. 1987, pp. 1588–1589.
Kumakura et al., "Ba α Y–Cu–O Superconducting Tape Prepared by Surface Diffusion Process" Jpn. J. Appl. Phys. 26(7) Jul. 1987, L1172 and 1173.
Japanese Journal Applied Physics; vol. 27, No. 8, 8–88, L1492–1494.
Japanese Journal of Applied Physics: vol. 26 No. 4, Apr. 1987 pp. L311–L313—Yoshizaki et al., "Superconducting Properties".
pp. L366–L367—Saito et al., "Properties in Various Sintering Atmosphere".
pp. L388–L390—Kawasaki et al., "Superconducting Films by Sputtering".
pp. L410–L412—Nagata et al., "Thin Films by Sputtering" –vol. 26 No. 5, May 1987.
pp. L709–L710—Adachi et al., "Superconducting Y–Ba–Cu–O Thin Films".
pp. L759–L760—Kohno et al., "La–Sr–Cu Oxide Wires".
pp. L334–L336—Matsuzaki et al., "Preparation of a High Tc Superconductor by Oxidization".
Appl. Physics Lett. vol. 51, No. 3, Jul. 20, 1987, Jin et al.—"High Tc Superconductors—Composite Wire Fabrication".

Primary Examiner—Patrick J. Ryan
Attorney, Agent, or Firm—Gene E. Shook; John R. Manning; James A. Mackin

[57] ABSTRACT

A ceramic superconductivity part, such as a wire 10, is produced through the partial oxidation of a specially formulated copper alloy in a core 12. The alloys contain low level quantities of rare earth and alkaline earth dopant elements. Upon oxidation at high temperature, superconducting oxide phases are formed as a thin film 14.

3 Claims, 1 Drawing Sheet

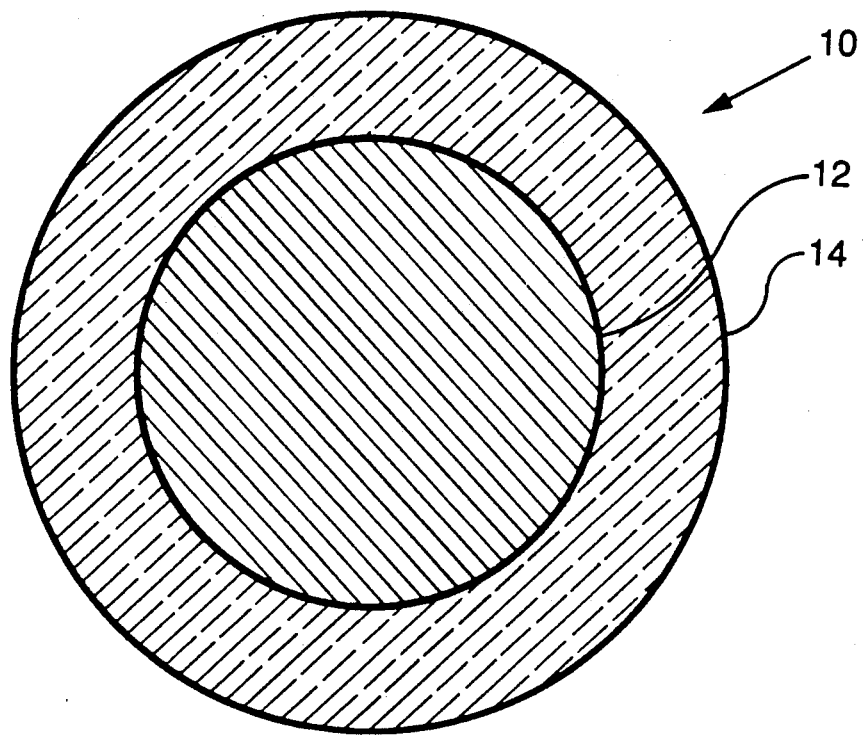

LOW COST, FORMABLE, HIGH TC SUPERCONDUCTING WIRE

ORIGIN OF THE INVENTION

The invention described herein was made by an employee of the United States Government and may be manufactured and used by or for the Government for governmental purposes without the payment of any royalties thereon or therefor.

TECHNICAL FIELD

This invention is concerned with forming high $T_c$ superconductive ceramic oxide films. The invention is particularly directed to producing completely formable superconducting articles.

In the prior art the production of ceramic superconductors involves sintering, hot pressing, or hot isostatic pressing ceramic oxide powders. The disadvantage of utilizing any of these methods is that the production of complex articles, such as long, fine wire, is totally precluded.

To produce superconducting wire it has been suggested that plasma spraying, chemical vapor deposition, or physical vapor deposition be utilized. It has also been suggested that fibers be drawn from molten oxide or organic precursor liquids. In another process, superconducting oxide powders are encapsulated in ductile metal tubing which is extruded into wire. While superconducting wire is potentially produced, a considerable degree of extra cost and effort is involved in coating, fiber drawing, or encapsulating. Furthermore, the total degree of fabricability in actual industrial applications, as opposed to laboratory demonstrations, still needs to be verified.

It has been suggested that special copper alloys be fully oxidized resulting in special oxide phases exhibiting superconductivity. This approach is somewhat unconventional in that relatively ductile copper alloy may indeed be fully formed. Then the alloy must be completely oxidized to form superconducting oxides of the R-A-Cu-O type, where R is a rare earth element, and A is an alkaline earth element. However, some compositional limitations exist. Y, a commonly used superconducting component element in $Y_1Ba_2Cu_3O_{7-x}$ superconductors, is immiscible in Y-Cu melts. Therefore, a homogeneous Y-Ba-Cu alloy is precluded as would be any subsequent $Y_1Ba_2Cu_3O_{7-x}$ superconducting phase.

A more serious disadvantage is that once the article is oxidized in the superconducting phase, it is entirely a brittle ceramic material. Therefore, a fully processed ceramic wire would not be amenable to the flexibility in the field normally associated with metal wire. Any processing following the oxidation step would be subject to the limitations concomitant with those of a brittle material. To circumvent this limitation, the R-A-Cu metal is preformed in a noble metal composite such as silver. This material and process are quite costly.

It is, therefore, an object of the invention to process superconducting articles, especially in wire form, without encountering the problems of poor ductility or complicated processing normally observed for the superconducting ceramic oxides.

BACKGROUND ART

U.S. Pat. No. 3,243,871 to Saur is directed to a method of making ductile superconductors. Pertinent steps in this process include cold drawing a wire and then cold working the wire. The wires are then heated to form $Nb_3Sn$ on the surface.

U.S. Pat. No. 4,171,464 to Steyert is concerned with a high specific heat superconducting composite material. This material includes a high specific heat ceramic in a metal conductor.

U.S. Pat. No. 4,339,508 to Tsuya et al describes a method for manufacturing a thin and flexible ribbon of superconducting material. The raw superconducting material is heated to a temperature between its melting point and 300° C. above the melting point and then ejecting the melt through a nozzle against a cooling surface of a moving substrate such as a rotating drum.

U.S. Pat. No. 4,411,959 to Braginski et al is related to a submicron-particle ductile superconductor. The submicron particles of superconductor are encapsulated in a metal tube and then fabricated down to a fine wire in the absence of sintering or reacting annealing, thereby avoiding the problems associated with the formation of brittle core or filaments.

DICLOSURE OF INVENTION

The problems of the prior art may be solved and the object achieved by the present invention. Ceramic superconductivity parts are produced through the partial oxidation of a specially formulated copper alloy. The alloys contain low level quantities of rare earth and alkaline earth dopant elements. Therefore, upon oxidation at high temperatures, the superconducting oxide phases may be formed as thin films.

Problems encountered in the prior art have been addressed in that the process of the present invention has the ability to produce wire configurations rather than just bulk solids. Also the process exhibits an ease in forming oxide films without the expense of a separate complicated coating step. The present invention further illustrates the ease of metal wire fabrication compared to ceramic fibers, and it has the ability to form composite wires into useful devices after partial conversion to the oxide phases. The invention gives more flexibility in alloy design because lower levels of rare earth and alkaline earth additions are needed. The invention avoids immisciblity problems at high Y-Cu concentrations, while avoiding mechanical forming problems caused by high R-A contents.

BRIEF DESCRIPTION OF THE DRAWING

The advantages and novel features of the invention will be more fully apparent from the following detailed description when read in connection with the accompanying drawing which is an enlarged cross-section view of an oxidized Y-Ba-Cu wire produced in accordance with the present invention.

BEST MODE FOR CARRYING OUT THE INVENTION

Referring now to the drawing there is shown a superconducting article, such as a coated wire 10, that is produced in accordance with the present invention by a partial oxidation of the specially formulated copper alloyed core 12. The alloy contains low level quantities of rare earth and alkaline earth elements.

More particularly up to ten atom percent of rare earth and alkaline earth dopants can be used in alloying the copper core 12. By way of example, yttrium and barium may be alloyed with the copper core 12.

A wire core 12 having a diameter of about 20 μm is believed to be satisfactory. Upon oxidation at high temperatures, $Y_1Ba_2Cu_3O_{7-x}$, are formed as thin films 14. Yttrium and barium will be preferentially oxidized with respect to the copper base element, even at low alloying levels, because Y and Ba are thermodynamically much more oxygen-active than is copper.

An analogous situation exists for NiCrAl+Zr alloys having about ten atom percent aluminium and about one atom percent zirconium. In this example, high temperature oxidation produces $Al_2O_3 + ZrO_2$ scales to the exclusion of NiO or $Cr_2O_3$. Thus films of any desired R-A-Cu-O superconducting phase can be produced on copper alloys by the proper selection of dopant levels and oxidation conditions.

An important advantage of utilizing the thin film 14 structure of the superconductor material is that such a form is extremely compliant in any type of post-processing fabrications steps. By way of example, such steps may include coiling or bending, as might be required for winding motor coils or installing power transmission lines. Therefore, the limitation of post-processing brittleness associated with prior art materials are avoided.

However, it is apparent that thin copper wires should be used so that the thin superconducting oxide films constitute a considerable fraction of the wire cross-section. By way of example, an oxide film 14 having a thickness between 5 μm and 20 μm is easily formed in oxidation and its thicknesses sufficiently thin to be flexible.

A copper wire radius of 20 μm would amount to only 44% of the total cross-section. This results in a substantial portion of the cross-sectional area being available for superconducting current.

A full bundle of coated wires as shown in the figure could transmit a large current as in the case of conventional electrical transmission. It is apparent that should loss of cryogenic fluid occur some conductivity would still be maintained through the copper wire substrate 12.

ALTERNATE EMBODIMENT OF THE INVENTION

It is further contemplated that alloying elements other than yttrium and barium may be utilized to form the superconducting phase. More particularly, lanthanum, or rare earth elements, such as ytterbium, europium and gadolinium, may be used as alloying elements instead of yttrium. Also, strontium, bismuth, and thallium may be substituted for barium.

Other elements may be required to assist in the exclusive formation of R-A-Cu-O during oxidation. Silicon, chromium, and aluminium may be used for this purpose.

It is further contemplated that oxidation exposures may require adjustment to precisely control and optimize the superconducting films. For example, $H_2$, $H_2O$, or F gases may be utilized to produce beneficial atomspheric modifications.

While several embodiments of the invention have been described, it will be apparent that various modifications may be made to the procedural steps of the invention without departing from the spirit thereof or the scope of the subjoined claims.

I claim:

1. A formable, high $T_c$ superconducting article comprising
    a thin copper alloy wire substrate having up to about five atom percent of elements selected from the group consisting essentially of yttrium and barium alloyed therewith, and
    a highly compliant, thin, superconducting adherent $Y_1Ba_2Cu_3O_{7-x}$ scale film thereon, said film forming a major fraction of the wire cross section.

2. A superconducting article as claimed in claim 1 wherein the thin copper alloy wires have radii of about 20 μm.

3. A superconducting article as claimed in claim 2 wherein the thickness of the $Y_1Ba_2Cu_3O_{7-x}$ film is about 10 μm.

* * * * *